United States Patent
Mochida et al.

(10) Patent No.: US 11,062,772 B2
(45) Date of Patent: Jul. 13, 2021

(54) VARIABLE RESISTANCE NON-VOLATILE MEMORY DEVICE

(71) Applicant: PANASONIC CORPORATION, Osaka (JP)

(72) Inventors: Reiji Mochida, Osaka (JP); Kazuyuki Kouno, Osaka (JP); Takashi Ono, Osaka (JP); Masayoshi Nakayama, Kyoto (JP); Yuriko Hayata, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/957,830

(22) PCT Filed: Dec. 5, 2018

(86) PCT No.: PCT/JP2018/044775
§ 371 (c)(1),
(2) Date: Jun. 25, 2020

(87) PCT Pub. No.: WO2019/131025
PCT Pub. Date: Jul. 4, 2019

(65) Prior Publication Data
US 2021/0065795 A1 Mar. 4, 2021

(30) Foreign Application Priority Data

Dec. 29, 2017 (JP) .............................. JP2017-255138

(51) Int. Cl.
*G11C 13/00* (2006.01)
(52) U.S. Cl.
CPC ...... *G11C 13/0069* (2013.01); *G11C 13/0026* (2013.01); *G11C 13/0038* (2013.01); *G11C 2013/0078* (2013.01); *G11C 2213/79* (2013.01)
(58) Field of Classification Search
None
See application file for complete search history.

(56) References Cited

U.S. PATENT DOCUMENTS

2004/0227166 A1  11/2004  Portmann et al.
2005/0174840 A1  8/2005  Tsushima et al.
(Continued)

FOREIGN PATENT DOCUMENTS

JP      4148210 B2    9/2008
JP      4670252 B2    4/2011
(Continued)

OTHER PUBLICATIONS

International Search Report and Written Opinion dated Mar. 12, 2019 in International Application No. PCT/JP2018/044775; with partial English translation.

*Primary Examiner* — Tan T. Nguyen
(74) *Attorney, Agent, or Firm* — McDermott Will and Emery LLP

(57) ABSTRACT

A variable resistance non-volatile memory device includes a memory cell array including memory cells, a write circuit, and a control circuit. Each memory cell includes a memory element that is a non-volatile and variable-resistance memory element, and a cell transistor. The write circuit includes a source line driver circuit connected to the cell transistor and a bit line driver circuit connected to the memory element. When performing a write operation of changing the memory element to a low resistance state, the control circuit performs control for allowing current having a first current value to flow through the memory element, and subsequently performs control for allowing current having a second current value to flow through the memory element. The second current value is greater than the largest value of overshoot current flowing through the memory element after the start of the changing of the memory element to the low resistance state.

9 Claims, 7 Drawing Sheets

(56) References Cited

U.S. PATENT DOCUMENTS

| | | |
|---|---|---|
| 2006/0067106 A1 | 3/2006 | Mori et al. |
| 2009/0097332 A1* | 4/2009 | Kim .................... G11C 11/4076 365/189.07 |
| 2010/0328993 A1 | 12/2010 | Ohmori et al. |
| 2012/0020141 A1 | 1/2012 | Kitagawa et al. |
| 2013/0215669 A1* | 8/2013 | Haukness .......... G11C 13/0028 365/148 |
| 2015/0364193 A1 | 12/2015 | Shimakawa et al. |
| 2017/0309335 A1 | 10/2017 | Mori et al. |

FOREIGN PATENT DOCUMENTS

| | | |
|---|---|---|
| JP | 2012-027972 A | 2/2012 |
| JP | 5287544 B2 | 9/2013 |
| JP | 2016-021272 A | 2/2016 |
| WO | 2016/072173 A1 | 5/2016 |

\* cited by examiner

VARIABLE RESISTANCE NON-VOLATILE MEMORY DEVICE

CROSS-REFERENCE OF RELATED APPLICATIONS

This application is the U.S. National Phase under 35 U.S.C. § 371 of International Patent Application No. PCT/JP2018/044775, filed on Dec. 5, 2018, which in turn claims the benefit of Japanese Application No. 2017-255138, filed on Dec. 29, 2017, the entire disclosures of which Applications are incorporated by reference herein.

The present disclosure relates to a variable resistance non-volatile memory device including memory cells each including a variable resistance non-volatile memory element.

BACKGROUND ART

A variable resistance non-volatile memory device including memory cells each including a variable resistance non-volatile memory element has been known. Such a memory element exhibits a behavior that its resistance value reversibly changes due to electrical signals for instance, and is capable of storing, in a non-volatile manner, data indicating the resistance value. When writing to a memory element is performed, a resistance change operation of changing the memory element to a low resistance state or a high resistance state is performed.

Patent Literature (PTL) 1, for example, recites that a set operation and a reset operation of a memory cell including a variable resistance non-volatile memory element are performed in parallel. PTL 2 describes changing a writing method between the case of changing a memory element to a low resistance state and the case of changing the memory element to a high resistance state. PTL 3 discloses a memory device that causes a memory element to store ternary or higher-value information.

CITATION LIST

Patent Literature

PTL 1: Japanese Unexamined Patent Application Publication No. 2012-027972
PTL 2: Japanese Patent No. 5287544
PTL 3: Japanese Patent No. 4670252

SUMMARY OF THE INVENTION

Technical Problem

Recently, however, there has been a demand to further increase the number of times for rewrite operations in a variable resistance memory element. In order to meet this demand, it is necessary to consider also the transitional state of the variable resistance non-volatile memory element for a stable resistance change operation.

The present disclosure has an object to enable the stable continuation of a resistance change operation performed by a variable resistance memory element.

Solution to Problem

A variable resistance non-volatile memory device according to an exemplary embodiment of the present disclosure includes: a memory cell array including memory cells; a write circuit that writes to the memory cells; and a control circuit. Each of the memory cells includes: a memory element that is non-volatile and variable-resistance, and reversibly changes between a low resistance state and a high resistance state; and a cell transistor connected in series to the memory element. The write circuit includes: a source line driver circuit that is connected to the cell transistor via a source line and allows current to flow between one of the memory cells and a first voltage source or a reference potential; and a bit line driver circuit that is connected to the memory element via a bit line and allows current to flow between one of the memory cells and a second voltage source or the reference potential. When carrying out a write operation of changing the memory element to the low resistance state, the control circuit performs, on the source line driver circuit, (i) a first control for allowing a first write current to flow through the memory element, to start the changing of the memory element to the low resistance state, the first write current having a first current value and flowing in a direction from the source line to the bit line, and after the first control, a second control for allowing a second write current to flow through the memory element, the second write current having a second current value and flowing in the same direction as the direction of the first write current allowed to flow in the first control. The second current value is greater than the largest value of overshoot current flowing through the memory element after the start of the changing of the memory element to the low resistance state.

With such a variable resistance non-volatile memory device, it is possible to prevent unintended over current from flowing through a variable resistance non-volatile memory element since current flowing through the memory element does not exceed a second current value that determines the resistance value of the memory element. Since it is possible to inhibit variation in the characteristics of the memory element, this enables more stable continuation of a resistance change operation performed by the memory element.

Advantageous Effect of Invention

According to the present disclosure, it is possible to enable a variable resistance non-volatile element to stably continue a resistance change operation. Accordingly the longevity of a variable resistance non-volatile memory element and the longevity of a variable resistance non-volatile memory device that uses the variable resistance non-volatile memory element can be achieved.

DESCRIPTION OF EXEMPLARY EMBODIMENT

Figure 1:
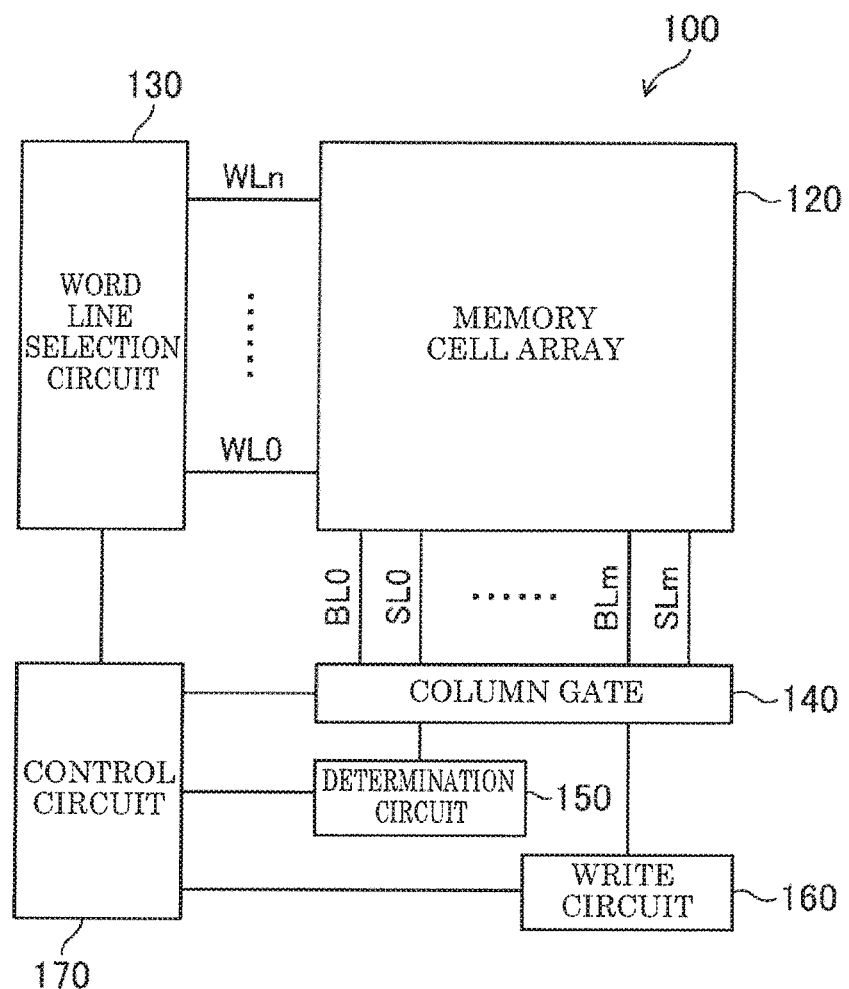
FIG. 1 is a block diagram illustrating an overall configuration of a variable resistance non-volatile memory device according to an embodiment of the present disclosure.

Hereinafter, an embodiment of the present disclosure will be described with reference to the accompanying Drawings. In the drawings, elements assigned with like reference signs are same or similar elements.

FIG. 1 is a block diagram illustrating an overall configuration of a variable resistance non-volatile memory device according to the embodiment of the present disclosure. Memory device 100 in FIG. 1 includes memory cell array 120, word line selection circuit 130, column gate 140, determination circuit 150, write circuit 160, and control circuit 170.

Memory cell array 120 includes a plurality of memory cells. These memory cells are arranged, for example, in a matrix. Memory cell array 120 includes n+1 (n is a positive integer) number of word lines WL0 to WLn, m+1 (m is a positive integer) number of bit lines BL0 to BLm, and m+1 number of source lines SL0 to SLm. Control circuit 170 controls word line selection circuit 130, column gate 140, determination circuit 150, and write circuit 160 by supplying a control signal to these circuits. Control circuit 170 controls read and write operations for each of the memory cells in memory cell array 120 by controlling these circuits.

Word line selection circuit 130 selects one word line from among word lines WL0 to WLn in memory cell array 120, to drive the selected word line according to a control signal from control circuit 170. Column gate 140 is connected to bit lines BL0 to BLm and source lines SL0 to SLm. Column gate 140 selects one bit line from among bit lines BL0 to BLm and selects one source line corresponding to the selected bit line from among source lines SL0 to SLm, according to the signal control from control circuit 170.

Determination circuit 150 is connected to the bit line and the source line which are selected by column gate 140. Current flows through the selected bit line and the selected source line via a memory cell that is connected to the word line selected by word selection circuit 130. Determination circuit 150 detects the current and outputs output data in accordance with the detection result. The bit line and the source line which are selected by column gate 140 are connected to write circuit 160. Write circuit 160 supplies, according to the control signal from control signal 170, a rewrite voltage and a rewrite current to the memory cell that is included in memory cell array 120 and is connected to the selected bit line and the selected source line.

Figure 2:
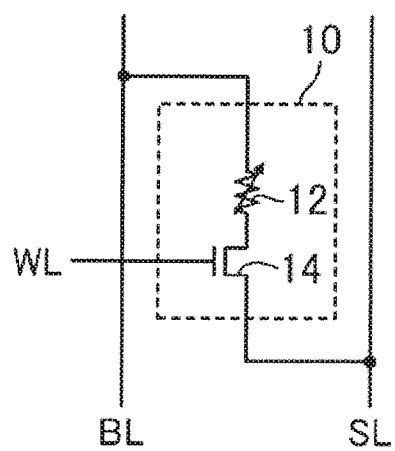
FIG. 2 is a circuit diagram illustrating one of memory cells included in a memory cell array in FIG. 1.

FIG. 2 is a circuit diagram illustrating one memory cell included in the memory cell array illustrated in FIG. 1. Memory cell 10 in FIG. 2 is a 1T1R memory cell and includes one variable resistance non-volatile memory element 12 and one cell transistor 14 connected in series to memory element 12. Cell transistor 14 is an n-channel metal oxide semiconductor (NMOS) transistor.

Memory element 12 is a resistive change element and is also referred to as a variable resistance memory. Word line WL is a word line, among word lines WL0 to WLn in FIG. 1, which corresponds to memory cell 10 and is connected to the gate of cell transistor 14. Bit line BL is a bit line, among bit lines BL0 to BLm, which corresponds to memory cell 10 and is connected to memory element 12. Source line SL is a source line, among source lines SL0 to SLm, which corresponds to memory cell 10 and is connected to the source of cell transistor 14.

Figure 3:
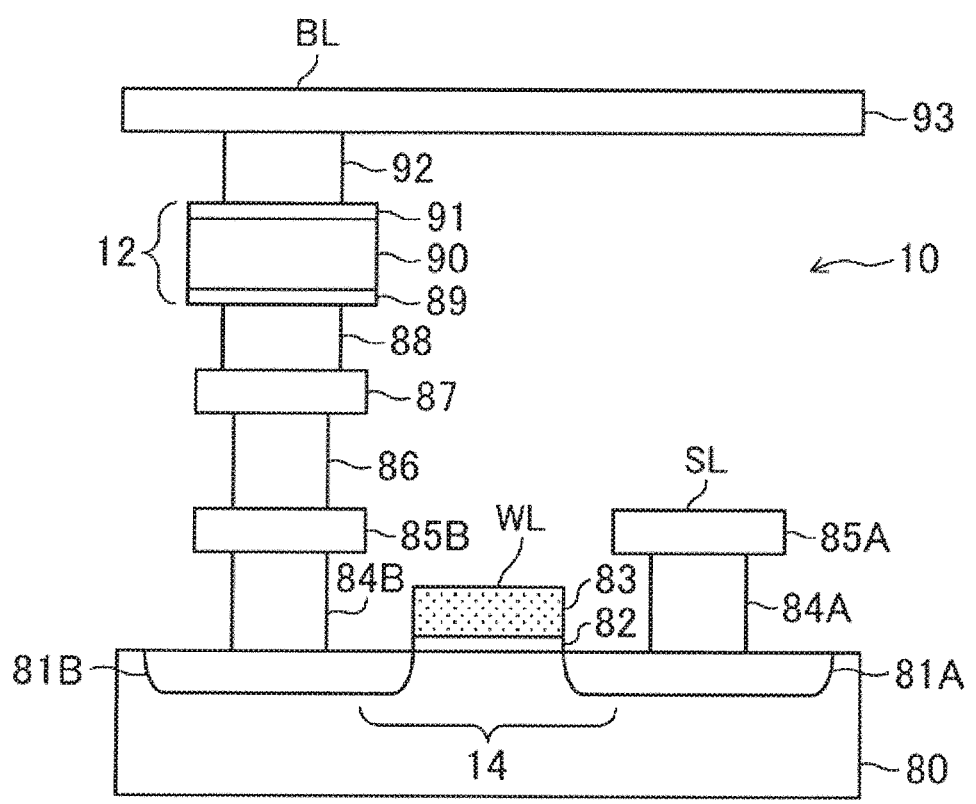
FIG. 3 is a cross-sectional view of the memory cell illustrated in FIG. 2.

FIG. 3 is a cross-sectional view of memory cell 10 illustrated in FIG. 2. Diffusion regions 81A and 81B are formed in the surface portion of semiconductor substrate 80. Diffusion region 81A forms the source of cell transistor 14 and diffusion region 81B forms the drain of cell transistor 14. A channel region of cell transistor 14 is formed between diffusion region 81A and diffusion region 81B. Oxide film 82 and gate electrode 83 made from, for example, polysilicon are formed on the channel region.

Diffusion region 81A is connected to wiring 85A in a first wiring layer via via 84A. Wiring 85A is source line SL. Diffusion region 81B is connected to wiring 85B in the first wiring layer via via 84B. Wiring 85B is connected to wiring 87 in a second wiring layer via via 86, and wiring 87 is connected to memory element 12 via via 88.

Memory element 12 includes bottom electrode 89, resistance change layer 90, and top electrode 91. Memory element 12 is connected to wiring 93 in a third wiring layer via via 92. Wiring 93 is bit line BL.

Memory element 12 is a variable resistance non-volatile memory element that reversibly changes between a low resistance state and a high resistance state. Memory element 12 changes to a low resistance state by allowing current to flow through memory cell 10 in a direction from a source line to a bit line. Namely, memory element 12 and memory cell 10 are changed to the low resistance (LR) state. Memory element 12 changes to a high resistance state by allowing current to flow through memory cell 10 in a direction from the bit line to the source line. Namely memory element 12 and memory cell 10 are changed to the high resistance (HR) state. Memory cell 10 is capable of storing 1 bit by memory element 12 keeping its low or high resistance state. More specifically, the change of memory element 12 to the low resistance (LR) state is started by the application of a resistance change start voltage to the both ends of memory element 12. When the voltage of memory element 12 reaches a resistance change end voltage, the resistance value of memory element 12 that has been changed to the LR state is determined according to the magnitude of the current flowing through memory element 12 at that time.

Figure 4:
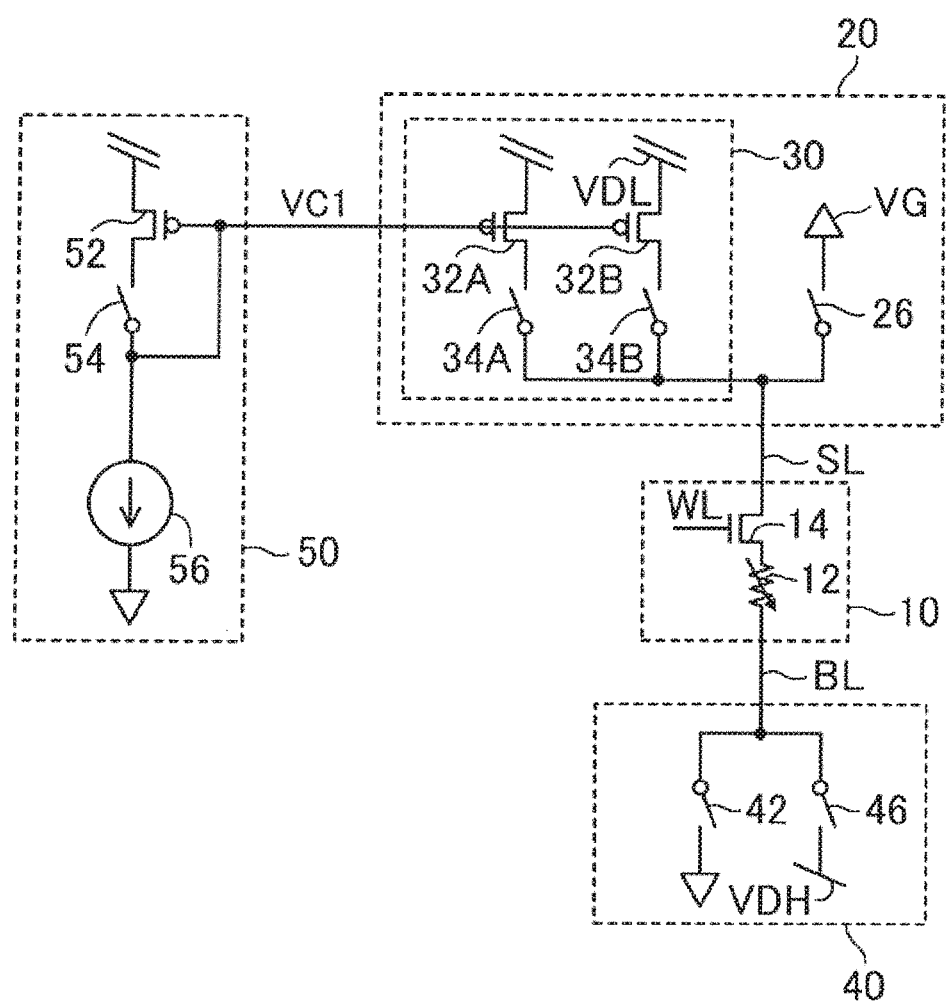
FIG. 4 is a circuit diagram illustrating examples of the memory cell illustrated in FIG. 2 and a write circuit that writes to the memory cell.

FIG. 4 is a circuit diagram illustrating examples of memory cell 10 illustrated in FIG. 2 and write circuit 160 that writes to memory cell 10, Write circuit 160 illustrated in FIG. 1 includes source line driver circuit 20, bit line driver circuit 40, and clamp voltage generator circuit 50. FIG. 4 illustrates bit line BL and source line SL which are selected by column gate 140, and word line WL selected by word line selection circuit 130. The memory cells in memory cell array 120 commonly use source line driver circuit 20 and bit line driver circuit 40. Memory cell 10 illustrated in FIG. 4 is a memory cell selected from among the memory cells in memory cell array 120, as a target memory cell on which a write operation is to be performed.

Source line driver circuit 20 includes source line switch 26 and current limiting circuit 30. Source line driver circuit 20 allows current to flow between memory cell 10 and LR voltage source VDL or reference potential VG. Source line switch 26 is connected between reference potential VG and source line SL.

Current limiting circuit 30 includes clamp transistors 32A and 32B and source line switches 34A and 34B. Clamp transistors 32A and 32B are each a p-channel metal oxide semiconductor (PMOS) transistor. Clamp transistor 32A and source line switch 34A are connected in series between source line SL and LR voltage source VDL. Clamp transistor 32B and source line switch 34B are connected in series between source line SL and LR voltage source VDL.

More specifically, the drain of clamp transistor 32A is connected to source line SL via source line switch 34A and the source of clamp transistor 32A is connected to LR voltage source VDL. The drain of clamp transistor 32B is connected to source line SL via source line switch 34B and the source of clamp transistor 32B is connected to LR voltage source VDL.

It is to be noted that the drain of damp transistor 32A may be connected to source line SL and the source of clamp transistor 32A may be connected to LR voltage source VDL via source line switch 34A. Moreover, the drain of clamp transistor 32B may be connected to source line SL and the source of clamp transistor 32B may be connected to LR voltage source VDL via source line switch 34B.

Bit line driver circuit 40 includes bit line switches 42 and 46. Bit line driver circuit 40 allows current to flow between memory cell 10 and reference potential VG or HR voltage source VDH. Bit line switch 42 is connected between bit line BL and reference potential VG. Bit line switch 46 is connected between bit line BL and HR voltage source VDH.

Clamp voltage generator circuit 50 includes mirror transistor 52, mirror switch 54, and current source 56. Mirror transistor 52 is a PMOS transistor. Mirror transistor 52 and mirror switch 54 are connected in series. More specifically, the source of mirror transistor 52 is connected to LR voltage source VDL and the drain of mirror transistor 52 is connected to one end of current source 56 via mirror switch 54. The other end of current source 56 is connected to the reference potential. The gate of mirror transistor 52 is connected to the drain of mirror transistor 52 via mirror switch 54. The gate of mirror transistor 52 is connected to the gates of clamp transistors 32A and 32B in current limiting circuit 30. Clamp voltage generator circuit 50 supplies, as clamp voltage VC1, the voltage of the gate of mirror transistor 52 to the gates of clamp transistors 32A and 32B. Current source 56 outputs a constant current of, for example, 10 µA.

It is to be noted that the source of mirror transistor 52 may be connected to LR voltage source VDL via mirror switch 54 and the drain of mirror transistor 52 may be connected to the gate of this transistor. Clamp voltage generator circuit 50 does not need to include mirror switch 54. In this case, the drain and the gate of mirror transistor 52 are short-circuited as well as the source of mirror transistor 52 and LR voltage source VDL are short-circuited, as is the case where mirror switch 54 is turned on.

Mirror transistor 52 and clamp transistor 32A constitute a current mirror. Mirror transistor 52 and clamp transistor 32B also constitute a current mirror. The size of clamp transistor 32A is, for example, five times as large as the size of mirror transistor 52, and the size of clamp transistor 32B is fifteen times as large as the size of mirror transistor 52.

Source line switches 26, 34A, and 34B, bit line switches 42 and 46, and mirror switch 54 are each a general switch included in a transistor, for example. The sizes, configurations, and gate voltages of these transistors are set such that a voltage drop occurred in each of the switches is made smaller and current flowing through these switches is less affected.

When memory cell 10 is changed to the HR state, control circuit 170 turns off mirror switch 54, source line switches 34A and 34B, and bit line switch 42 and turns on source line switch 26 and bit line switch 46. As a result, current flows from bit line BL to source line SL and memory cell 10 is changed to the HR state.

Figure 5:
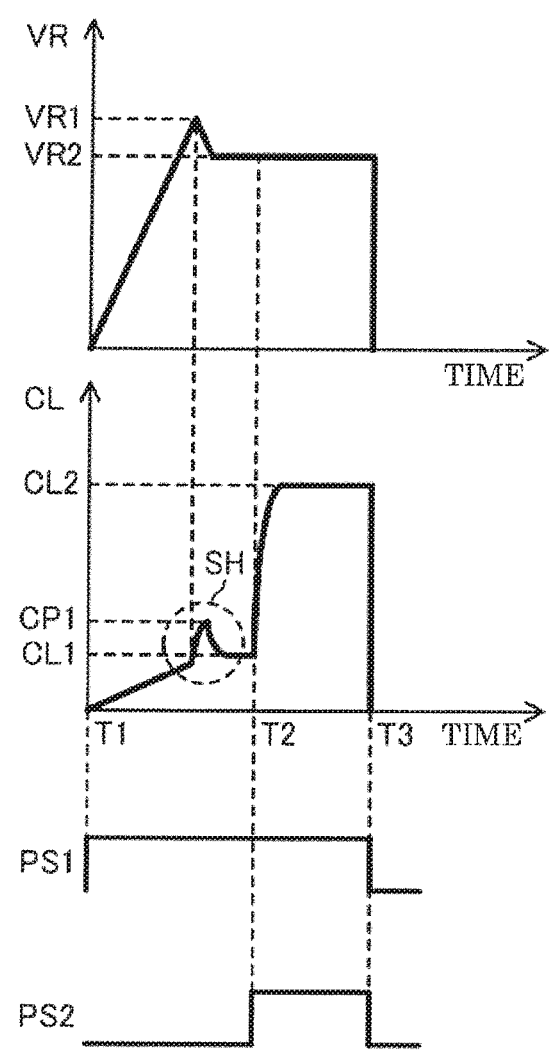
FIG. 5 shows graphs illustrating examples of waveforms of voltage and current of the memory element when the memory cell is changed to a low resistance state using the circuit illustrated in FIG. 4.

FIG. 5 is a graph illustrating examples of the waveforms of voltage and current of memory element 12 when memory cell 10 is changed to an LR state using the circuit illustrated in FIG. 4. When memory cell 10 is changed to the LR state, that is, when a write operation is performed to change memory element 12 to a low resistance state, control circuit 170 controls source line driver circuit 20 as follows. Namely, control circuit 170 performs a first control for allowing write current CL, which has first current value CL1 and flows through memory element 12 in a direction from source line SL to bit line BL, to flow to start the change of memory element 12 to a low resistance state, and after that, performs a second control for allowing write current CL, which has second current value CL2 and flows through memory element 12 in the same direction as that of write current CL allowed to flow in the first control, to flow. Second current value CL2 here is greater than the largest value CP1 of overshoot SH write current CL flowing through memory element 12 after the start of the change of memory element 12 to the low resistance state.

First, control circuit 170 performs the aforementioned first control by turning on source line switch 34A. More specifically, control circuit 170 turns on mirror switch 54, source line switch 34A, and bit line switch 42 at time T1 in accordance with write pulse PS1. Here, source line switch 26 and bit line switch 46 remain to be off. As a result, write current CL, which has first current value CL1 (e.g., 50 µA) and is determined based on the ratio of the size of clamp transistor 32A to the size of mirror transistor 52, flows from source line SL to bit line BL via memory element 12.

Referring to FIG. 5, voltage VR and write current CL of memory element 12 increase from time T1, and when memory element voltage VR reaches resistance change start voltage VR1, the change of memory element 12 to the LR state is started and the resistance value of memory element 12 decreases. As a result, write current CL starts overshooting and when write current CL reaches peak value CP1 of overshoot SH, write current CL decreases to first current value CL1. After reaching resistance change start voltage VR1, memory element voltage VR decreases to constant voltage VR2. The reason why write current CL overshoots is because the electric charges of source line SL flow into memory element 12 when the change of memory element 12 to the LR state starts. Peak value CP1 of overshoot SH can be derived in advance based on the capacitance of, for instance, a source line and the electric potential at each part.

Next, control circuit 170 performs the aforementioned second control by turning on source line switch 34B. More specifically control circuit 170 turns on source line switch 34B at time T2 in accordance with write pulse PS2. As a result, the current (e.g., 150 µA), which is determined based on the ratio of the size of clamp transistor 32B to the size of mirror transistor 52, flows more in the direction from source line SL to bit line BL. In other words, write current CL, which has second current value CL2 (e.g., 200 µA) obtained by adding current flowing through clamp transistor 32B to current flowing through clamp transistor 32A, flows from source line SL to bit line BL via memory element 12.

Referring to FIG. 5, write current CL increases and reaches second current value CL2 after time T2. Memory element voltage VR remains almost the same as voltage VR2. Since memory element 12 has already been changed to the LR state, write current CL does not overshoot at time T2 and onward. Since voltage VR2 is a resistance change end voltage, the resistance value of memory element 12 changes to the resistance value determined by second current value CL2.

It should be noted that control circuit 170 may turn off source line switch 34A when turning on source line switch 34B. In this case, write current CL having second current value CL2 (e.g., 150 µA) and flowing through clamp transistor 32B flows through memory element 12.

Next, control circuit 170 turns off mirror switch 54, source line switches 34A and 34B, and bit line switch 42 at time T3 when write pulses PS1 and PS2 are ended, With this, the control performed for the change to the LR state is ended.

First current value CL1 is set such that overshoot peak value CP1 of write current CL after the start of the change of memory element 12 to the LR state does not exceed second current value CL2. Namely second current value CL2 is set to be greater than peak value CP1. Since write current CL does not exceed second current value CL2 which determines the resistance value of memory element 12, it is possible to prevent unintended over current from flowing through memory element 12. Moreover, since it is possible to inhibit the amount of write current CL to be relatively small from time T1 to time T2 during which control is performed so that current having first current value CL1 flows, the rise of memory element, voltage VR becomes moderate and it is possible to inhibit the application of over-voltage exceeding a resistance change start voltage to memory element 12.

Figure 6:
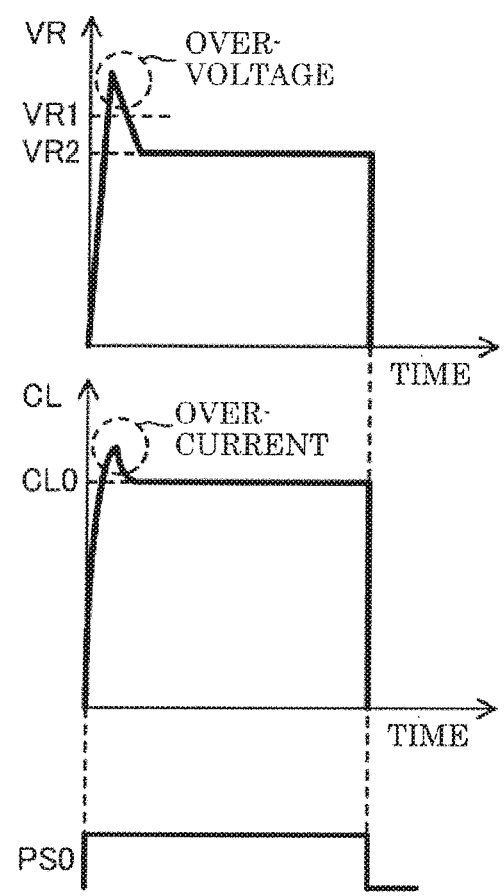
FIG. 6 shows graphs illustrating examples of waveforms of voltage and current of the memory element when the memory cell is changed to a low resistance state using a conventional circuit.

FIG. 6 is a graph illustrating examples of the waveforms of voltage and current of memory element 12 when memory cell 10 is changed to an LR state using a conventional circuit. When it is controlled so that write current CL having current value CL0 flows through memory element 12, in accordance with write pulse PS0, over current having a value larger than current value CL0 unintentionally flows when the change to the LR state is started. This is because the electric charges of source line SL flow into memory element 12 when the change of memory element 12 to the low resistance state is started, as described above. Moreover, since memory element voltage VR rapidly rises, memory element voltage VR greatly exceeds resistance change start voltage VR1 and over-voltage is applied to memory element 12. Such overcurrent and overvoltage increase variation in the characteristics of memory element 12 and memory cell 10.

Figure 7:
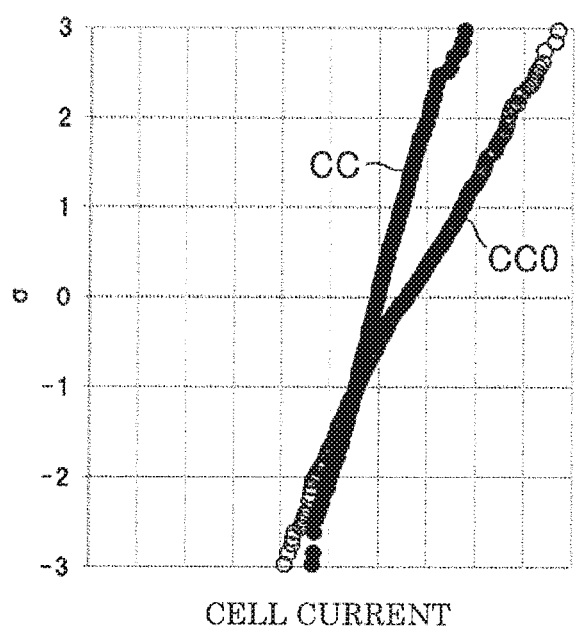
FIG. 7 is a graph illustrating a normal quantile-quantile plot of a cell current that flows, when a read operation is performed, through the memory cell that has been changed to a low resistance state.

FIG. 7 is a graph illustrating a normal quantile-quantile plot of a cell current that flows, when a read operation is performed, through memory cell 10 that has been changed to an LR state. In current distribution CC0 (white circles) observed when a write operation is performed using a conventional circuit, the gradient of change is small and current variability is large. In contrast, in current distribution CC (black circles) observed when a write operation is performed using the circuit according to this embodiment, the gradient of change is large and current variability is small. It is conceivable that such results are obtained because over current flows through memory element 12 and over-voltage is also applied to memory element 12 in the case where a write operation is performed using a conventional circuit, and accordingly, the characteristics of memory element 12 and memory cell 10 are affected and cell current variation is significant when a read operation is performed. In contrast, in the case where a write operation is performed using the circuit according to this embodiment, neither over current flows through memory element 12 nor high overvoltage is applied to memory element 12, and therefore, cell current variation is small. Accordingly, variable resistance non-volatile memory device 100 according to this embodiment enables the stable continuation of a resistance change operation for a change to an LR state or an HR state, and thereby achieving the longevity of memory device 100.

Figure 8:
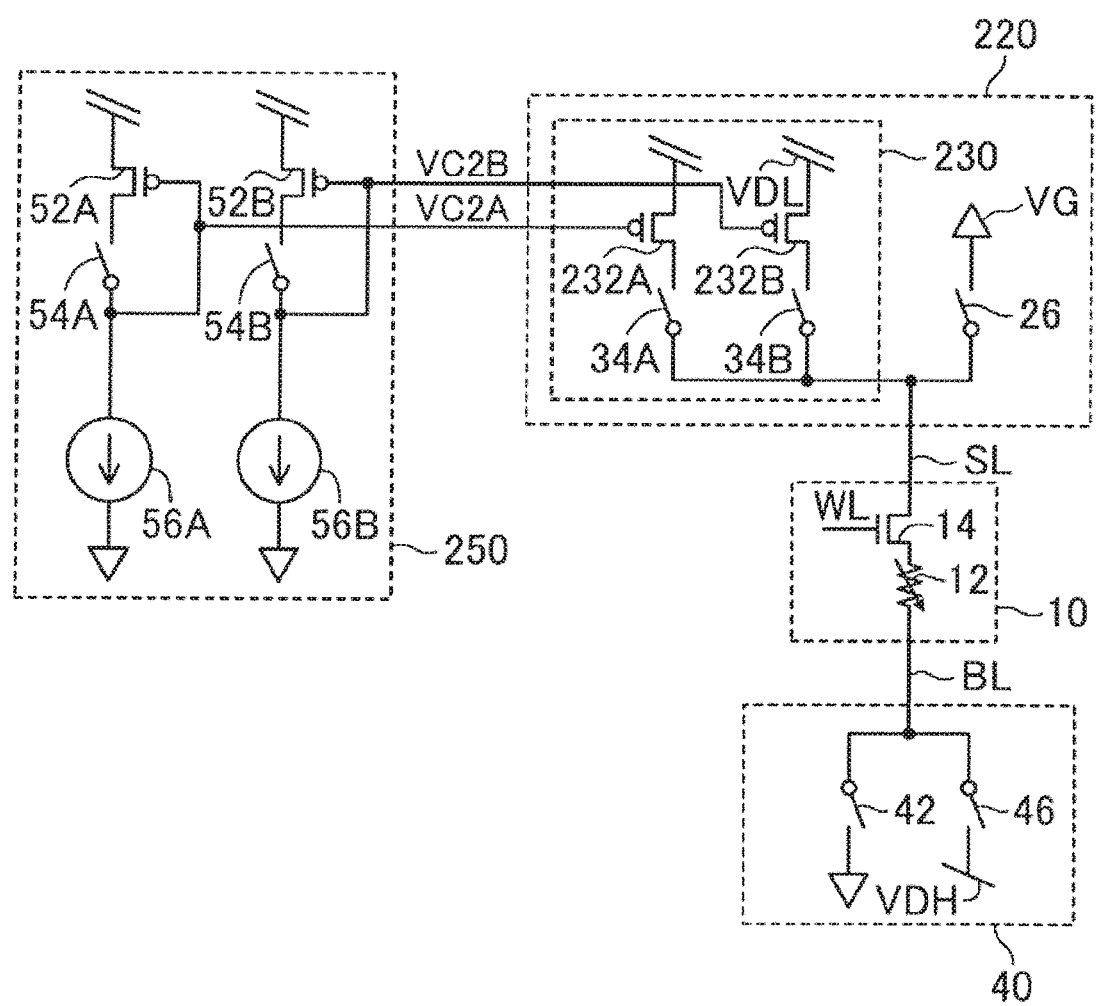
FIG. 8 is a circuit diagram illustrating other examples of the memory cell illustrated in FIG. 2 and the write circuit that writes to the memory cell.

FIG. 8 is a circuit diagram illustrating examples of memory cell 10 illustrated in FIG. 2 and write circuit 160 that writes to memory cell 10. Write circuit 160 illustrated in FIG. 1 may include source line driver circuit 220 and clamp voltage generator circuit 250 as illustrated in FIG. 8, instead of source line driver circuit 20 and damp voltage generator circuit 50 illustrated in FIG. 4.

Source line driver circuit 220 includes source line switch 26 and current limiting circuit 230. Source line driver circuit 220 allows current to flow between memory cell 10 and reference potential VG or LR voltage source VDL. Current limiting circuit 230 includes clamp transistors 232A and 232B as current limiting elements, instead of clamp transistors 32A and 32B, and has the same configuration as that of current limiting circuit 30 illustrated in FIG. 4, except that an input signal to clamp transistors 232A and 232B is different.

It should be noted that the drain of clamp transistor 232A may be connected to source line SL and the source of clamp transistor 232A may be connected to LR voltage source VDL via source line switch 34A. Moreover, the drain of clamp transistor 232B may be connected to source line SL and the source of clamp transistor 232B may be connected to LR voltage source VDL via source line switch 34B.

Clamp voltage generator circuit 250 includes mirror transistors 52A and 52B, mirror switches 54A and 54B, and current sources 56A and 56B. Mirror transistors 52A and 52B are each a PMOS transistor.

Mirror transistor 52A and mirror switch 54A are connected in series. More specifically, the source of mirror transistor 52A is connected to LR voltage source VDL and the drain of mirror transistor 52A is connected to one end of current source 56A via mirror switch 54A. The other end of current source 56A is connected to the reference potential. The gate of mirror transistor 52A is connected to the drain of mirror transistor 52A via mirror switch 54A. The gate of mirror transistor 52A is connected to the gate of clamp transistor 232A in current limiting circuit 230. Clamp voltage generator circuit 250 supplies, as clamp voltage VC2A, the voltage of the gate of mirror transistor 52A to the gate of mirror transistor 232A. Current source 56A outputs a constant current of, for example, 10 µA.

Mirror transistor 52B and mirror switch 54B are connected in series. More specifically, the source of mirror transistor 52B is connected to LR voltage source VDL and the drain of mirror transistor 52B is connected to one end of current source 56B via mirror switch 54B. The other end of current source 56B is connected to the reference potential. The gate of mirror transistor 52B is connected to the drain of mirror transistor 52B via mirror switch 54B. The gate of mirror transistor 52B is connected to the gate of clamp transistor 232B in current limiting circuit 230. Clamp voltage generator circuit 250 supplies, as clamp voltage VC2B, the voltage of the gate of mirror transistor 52B to the gate of clamp transistor 232B. Current source 56B outputs a constant current of, for example, 30 µA.

It should be noted that the source of mirror transistor 52A may be connected to LR voltage source VDL via mirror switch 54A and the drain of mirror transistor 52A may be connected to the gate thereof. Clamp voltage generator circuit 250 does not need to include mirror switch 54A. In this case, the drain and the gate of mirror transistor 52A are short-circuited as well as the source of mirror transistor 52A and LR voltage source VDL are short-circuited, as is the case where mirror switch 54A is turned on.

It is to be noted that he source of mirror transistor 52B may be connected to LR voltage source VDL via mirror switch 54B and the drain of mirror transistor 52B may be connected to the gate thereof. Clamp voltage generator circuit 250 does not need to include mirror switch 54B. In this case, the drain and the gate of mirror transistor 52B are short-circuited as well as the source of mirror transistor 52B and LR voltage source VDL are short-circuited, as is the case where mirror switch 54B is turned on.

Mirror transistor 52A and clamp transistor 232A constitute a current mirror. Mirror transistor 52B and clamp transistor 232B also constitute a current mirror. For example, the size of clamp transistor 232A is five times as large as the size of mirror transistor 52A, and the size of clamp transistor 232B is five times as large as the size of mirror transistor 52B.

Mirror switches 54A and 54B are each a general switch included in a transistor, for example. The sizes, configurations, and gate voltages of these transistors are set such that a voltage drop occurred in each of the switches is made smaller and current flowing through these switches is less affected.

First, control circuit 170 performs the aforementioned first control by turning on source line switch 34A. More specifically control circuit 170 turns on mirror switch 54A, source line switch 34A, and bit line switch 42 at time T1 in accordance with write pulse PS1. Here, source line switch 26 and bit line switch 46 remain to be off. As a result, write current CL, which has first current value CL1 (e.g., 50 μA) determined based on the ratio of the size of clamp transistor 232A to the size of mirror transistor 52A, flows from source SL to bit line BL via memory element 12.

Next, control circuit 170 performs the aforementioned second control by turning on source line switch 34B. More specifically, control circuit 170 turns on mirror switch 54B and source line switch 34B at time T2 in accordance with write pulse PS2. As a result, current (e.g., 150 μA) that is determined based on the ratio of the size of clamp transistor 232B to the size of mirror transistor 52B flows more from source line SL to bit line BL. In other words, write current CL, which has second current value CL2 (e.g., 200 μA) obtained by adding current flowing through clamp transistor 232B to current flowing through clamp transistor 232A, flows from source line SL to bit line BL via memory element 12.

It should be noted that control circuit 170 may turn off source line switch 34A when turning on source line switch 34B. In this case, write current CL, which has second current value CL2 (e.g., 150 μA) and flows through clamp transistor 232B, flows through memory element 12.

Next, control circuit 170 turns off mirror switches 54A and 54B, source line switches 34A and 34B, and bit line switch 42 at time T3 when write pulses PS1 and PS2 are ended. With this, control performed for a change to an LR state is ended. Voltage VR and write current CL of memory element 12 in the case of using the circuit illustrated in FIG. 8 change, as is the case described with reference to FIG. 5.

With the circuit illustrated in FIG. 8, it is possible to determine the size of clamp transistor 232B for allowing a relatively large amount of write current CL to flow, irrespective of the size of clamp transistor 232A. This reduces the size of clamp transistor 232B and this in turn makes it possible to reduce the area of the circuit.

Figure 9:
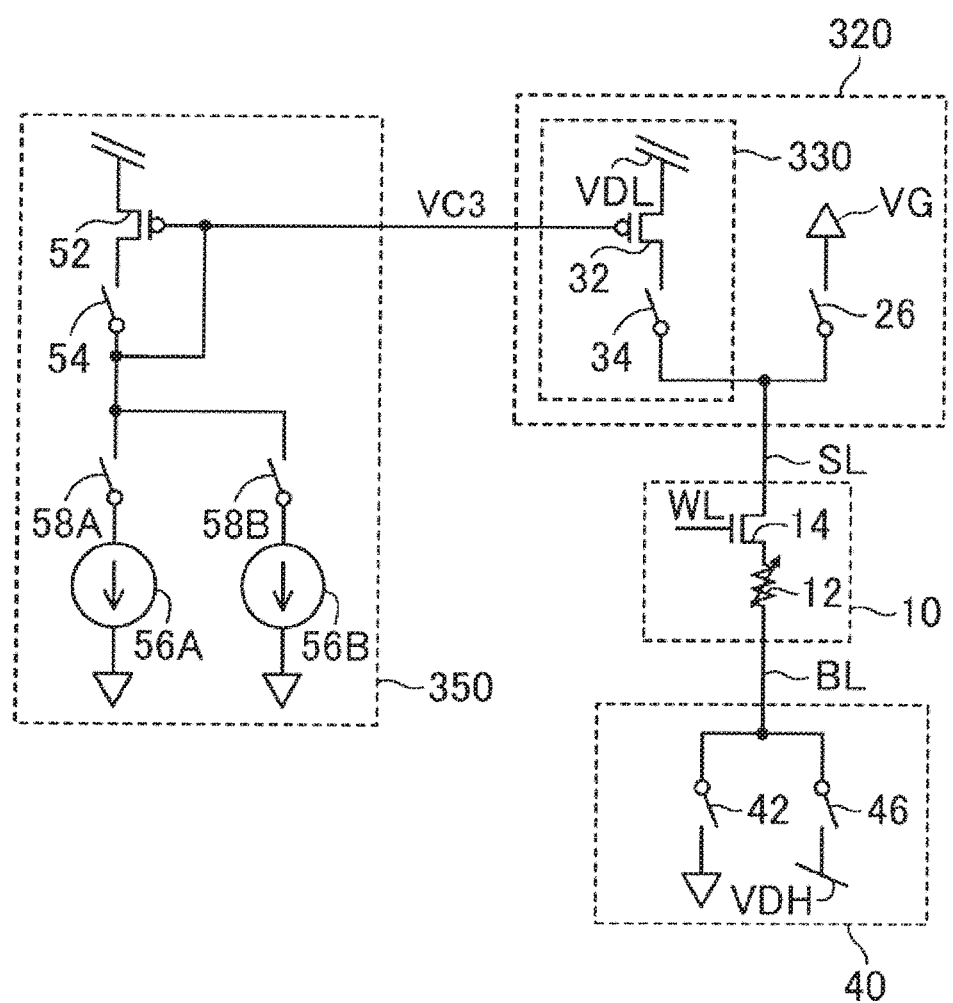
FIG. 9 is a circuit diagram illustrating yet other examples of the memory cell illustrated in FIG. 2 and the write circuit that writes to the memory cell.

FIG. 9 is a circuit diagram illustrating yet other examples of memory cell 10 illustrated in FIG. 2 and write circuit 160 that writes to memory cell 10. Write circuit 160 illustrated in FIG. 1 may include source line driver circuit 320 and clamp voltage generator circuit 350 as illustrated in FIG. 9 instead of source line driver circuit 20 and clamp voltage generator circuit 50 illustrated in FIG. 4.

Source line driver circuit 320 includes source line switch 26 and current limiting circuit 330. Source line driver circuit 320 allows current to flow between memory cell 10 and reference potential VG or LR voltage source VDL. Current limiting circuit 330 includes clamp transistor 32 as a current limiting element, and source line switch 34. Clamp transistor 32 is a PMOS transistor. Clamp transistor 32 and source line switch 34 are connected in series between source line SL and LR voltage source VDL. More specifically, the drain of clamp transistor 32 is connected to source line SL via source line switch 34 and the source of clamp transistor 32 is connected to LR voltage source VDL.

It should be noted that the drain of clamp transistor 32 may be connected to source line SL and the source of clamp transistor 32 may be connected to LR voltage source VDL via source line switch 34.

Clamp voltage generator circuit 350 includes mirror transistor 52, mirror switches 54, 58A, and 58B, and current sources 56A and 56B. Mirror transistor 52 is a PMOS transistor.

Mirror transistor 52 and mirror switch 54 are connected in series. More specifically, the source of mirror transistor 52 is connected to LR voltage source VDL and the drain of mirror transistor 52 is connected to one end of current source 56A and one end of current source 56B via mirror switch 54. The other ends of current sources 56A and 56B are connected to the reference potential. The gate of mirror transistor 52 is connected to the drain of mirror transistor 52 via mirror switch 54. The gate of mirror transistor 52 is connected to the gate of clamp transistor 32 in current limiting circuit 330. Clamp voltage generator circuit 350 supplies, as clamp voltage VC3, the voltage of the gate of mirror transistor 52 to the gate of clamp transistor 32. Current source 56A outputs a constant current of, for example, 10 μA. Current source 56B outputs a constant current of, for example, 30 μA.

It should be noted that the source of mirror transistor 52 may be connected to LR voltage source VDL via mirror switch 54 and the drain of mirror transistor 52 may be connected to the gate thereof. Clamp voltage generator circuit 350 does not need to include mirror switch 54. In this case, the drain and the gate of mirror transistor 52 are short-circuited as well as the source of mirror transistor 52 and LR voltage source VDL are short-circuited, as is the case where mirror switch 54 is turned on.

Mirror transistor 52 and clamp transistor 32 constitute a current mirror. Here, the size of clamp transistor 32 is, for example, five times as large as the size of mirror transistor 52.

Source line switch 34 and mirror switches 58A, 58B are each a general switch included in a transistor, for example. The sizes, configurations, and gate voltages of these transistors are set such that a voltage drop occurred in each of the switches is made smaller and current flowing through these switches is less affected.

First, control circuit 170 performs the aforementioned first control by turning on source line switch 34 and mirror switch 58A. More specifically control circuit 170 turns on mirror switches 54 and 58A, source line switch 34, and bit line switch 42 at time T1 in accordance with write pulse PS1. Here, source line switch 26 and bit line switch 46 remain to be off. As a result, write current CL, which has first current value CL1 (e.g., 50 µA) determined based on the current value of current source 56A and the ratio of the size of clamp transistor 32 to the size of mirror transistor 52, flows from source line SL to bit line BL via memory element 12. Here, clamp voltage generator circuit 350 outputs, as clamp voltage VC3, a voltage such that allows write current CL having first current value CL1 to flow through clamp transistor 32.

Next, control circuit 170 performs the aforementioned second control by turning on mirror switch 58B. More specifically, control circuit 170 turns on mirror switch 58B at time T2 in accordance with write pulse PS2. As a result, current (e.g., 150 µA), which is determined based on the current value of current source 56B and the ratio of the size of clamp transistor 32 to the size of mirror transistor 52, flows more from source line SL to bit line BL. In other words, write current CL, which has second current value CL2 (e.g., 200 µA) obtained by adding current flowing from current source 56A to current flowing from current source 56B, flows from source line SL to bit line BL via memory element 12. Clamp voltage generator circuit 350 changes clamp voltage VC3 when the second control is performed. The value of clamp voltage VC3 that has been changed is a value such that write current CL having second current value CL2 flows through clamp transistor 32.

It should be noted that control circuit 170 may turn off mirror switch 58A when turning on mirror switch 58B. In this case, write current CL, which has second current value CL2 (e.g., 150 µA) and flows from current source, flows through memory element 12.

Next, control circuit 170 turns off mirror switches 54, 58A, and 58B, source line switch 34, and bit line switch 42 at time T3 when write pulses PS1 and PS2 are ended. With this, control performed for a change to an LR state is ended. Voltage VR and write current CL of memory element 12 in the case of using the circuit illustrated in FIG. 9 change, as is the case described with reference to FIG. 5.

Since the circuit illustrated in FIG. 9 requires only one clamp transistor, it is possible to reduce the area of the circuit.

Although clamp voltage generator circuit 50 that supplies clamp voltage VC1, clamp voltage generator circuit 250 that supplies clamp voltages VC2A and VC2B, and clamp voltage generator circuit 350 that supplies clamp voltage VC3 are used as examples in the description, a circuit that supplies a clamp voltage is not limited to these and outputting an appropriate clamp voltage is required of the circuit. For example, a circuit that has a voltage regulator and outputs an output from the voltage regulator as a clamp voltage, a circuit that has a plurality of resistances connected in series and outputs, as a clamp voltage, a voltage obtained by dividing a voltage using these resistances, or a circuit that has a transistor and outputs, as a clamp voltage, a voltage in accordance with the threshold voltage of the transistor may be used instead of clamp voltage generator circuit 50, 250, or 350. Moreover, memory device 100 does not need to include clamp voltage generator circuit 50, 250, or 350. In this case, clamp voltages VC1, VC2A, VC2B, or VC3 is supplied from outside.

Many of the features and superiority of the present invention are apparent from the description herein and are intended to cover all of such features and superiority of the present invention by the scope of the appended claims. Moreover, multiple changes and modifications can be easily made by a person skilled in the art, and therefore, the present invention should not be limited to the same configuration and operation as those illustrated and described herein. Accordingly, proper modifications and equivalents shall all be included in the scope of the present invention.

INDUSTRIAL APPLICABILITY

As described above, the present disclosure is useful, for instance, for variable resistance non-volatile memory devices.

REFERENCE MARKS IN THE DRAWINGS

10 memory cell
12 memory element
14 cell transistor
20, 220, 320 source line driver circuit
32, 32A, 32B, 232A, 232B clamp transistor
34, 34A, 34B source line switch
40 bit line driver circuit
50, 250, 350 clamp voltage generator circuit
52, 52A, 52B mirror transistor
56, 56A, 56B current source
58A, 58B mirror switch
100 variable resistance non-volatile memory device
120 memory cell array
130 word line selection circuit
140 column gate
150 determination circuit
160 write circuit
170 control circuit
VC1, VC2A, VC2B, VC3 clamp voltage
VDL LR voltage source (first voltage source)
VDH HR voltage source (second voltage source)

The invention claimed is:

1. A variable resistance non-volatile memory device, comprising:
a memory cell array including memory cells;
a write circuit that writes to the memory cells; and
a control circuit, wherein
each of the memory cells includes:
  a memory element that is non-volatile and variable-resistance, and reversibly changes between a low resistance state and a high resistance state; and
  a cell transistor connected in series to the memory element,
the write circuit includes:
  a source line driver circuit that is connected to the cell transistor via a source line and allows current to flow between one of the memory cells and a first voltage source or a reference potential; and
  a bit line driver circuit that is connected to the memory element via a bit line and allows current to flow between one of the memory cells and a second voltage source or the reference potential,
when carrying out a write operation of changing the memory element to the low resistance state, the control circuit performs, on the source line driver circuit, (i) a first control for allowing a first write current to flow through the memory element, to start the changing of the memory element to the low resistance state, the first write current having a first current value and flowing in a direction from the source line to the bit line, and after the first control, (ii) a second control for allowing a second write current to flow through the memory element, the second write current having a second current value and flowing in a same direction as the direction of the first write current allowed to flow in the first control, and the second current value is greater than a largest value of overshoot current flowing through the memory element after the start of the changing of the memory element to the low resistance state.

2. The variable resistance non-volatile memory device according to claim 1, wherein
the source line driver circuit includes:
a first clamp transistor;
a second clamp transistor;
a first source line switch; and
a second source line switch,
the first clamp transistor and the first source line switch are connected in series between the first voltage source and the source line,
the second clamp transistor and the second source line switch are connected in series between the first voltage source and the source line,
a clamp voltage is supplied to a gate of the first clamp transistor and a gate of the second clamp transistor, and
the control circuit performs the first control by turning on the first source line switch and performs the second control by turning on the second source line switch.

3. The variable resistance non-volatile memory device according to claim 2, wherein
when turning on the second source line switch, the control circuit turns off the first source line switch.

4. The variable resistance non-volatile memory device according to claim 2, wherein
the write circuit further includes a clamp voltage generator circuit,
the clamp voltage generator circuit includes:
a mirror transistor having a source connected to the first voltage source; and
a current source connected between a drain of the mirror transistor and the reference potential,
the mirror transistor has a gate connected to the drain of the mirror transistor, and
the clamp voltage generator circuit supplies a voltage of the gate of the mirror transistor as the clamp voltage.

5. The variable resistance non-volatile memory device according to claim 1, wherein
the source line driver circuit includes:
a first clamp transistor;
a second clamp transistor;
a first source line switch; and
a second source line switch,
the first clamp transistor and the first source line switch are connected in series between the first voltage source and the source line,
the second clamp transistor and the second source line switch are connected in series between the first voltage source and the source line,
a first clamp voltage is supplied to a gate of the first clamp transistor,
a second clamp voltage is supplied to a gate of the second clamp transistor, and
the control circuit performs the first control by turning on the first source line switch and performs the second control by turning on the second source line switch.

6. The variable resistance non-volatile memory device according to claim 5, wherein
when turning on the second source line switch, the control circuit turns off the first source line switch.

7. The variable resistance non-volatile memory device according to claim 5, wherein
the write circuit further includes a clamp voltage generator circuit,
the clamp voltage generator circuit includes:
a first mirror transistor having a source connected to the first voltage source;
a first current source connected between a drain of the first mirror transistor and the reference potential;
a second mirror transistor having a source connected to the first voltage source; and
a second current source connected between a drain of the second mirror transistor and the reference potential,
the first mirror transistor has a gate connected to the drain of the first mirror transistor,
the second mirror transistor has a gate connected to the drain of the second mirror transistor, and
the clamp voltage generator circuit:
supplies a voltage of the gate of the first mirror transistor as the first clamp voltage; and
supplies a voltage of the gate of the second mirror transistor as the second clamp voltage.

8. The variable resistance non-volatile memory device according to claim 1, wherein
the write circuit further includes a clamp voltage generator circuit,
the source line driver circuit includes:
a clamp transistor; and
a source line switch,
the clamp transistor and the source line switch are connected in series between the first voltage source and the source line,
the clamp voltage generator circuit includes:
a mirror transistor having a source connected to the first voltage source;
a first current source;
a second current source;
a first mirror switch; and
a second mirror switch,
the first current source and the first mirror switch are connected in series between a drain of the mirror transistor and the reference potential,
the second current source and the second mirror switch are connected in series between the drain of the mirror transistor and the reference potential,
the mirror transistor has a gate connected to the drain of the mirror transistor and a gate of the clamp transistor, and
the control circuit performs the first control by turning on the source line switch and the first mirror switch, and performs the second control by turning on the second mirror switch.

9. The variable resistance non-volatile memory device according to claim 8, wherein
when turning on the second mirror switch, the control circuit turns off the first mirror switch.

* * * * *